United States Patent [19]

Martin

[11] Patent Number: 4,650,998
[45] Date of Patent: Mar. 17, 1987

[54] HIGHLY ALIGNED OPTICAL DEVICE

[75] Inventor: George Martin, San Jose, Calif.

[73] Assignee: Siemens Corporate Research & Support, Inc., Iselin, N.J.

[21] Appl. No.: 679,838

[22] Filed: Dec. 10, 1984

[51] Int. Cl.$^4$ .............................................. H01J 5/02
[52] U.S. Cl. .................................. 250/239; 250/221; 250/338
[58] Field of Search ...................... 250/239, 221, 338

[56] References Cited

U.S. PATENT DOCUMENTS 4,005,288  1/1977  Robillard ........................... 250/239

Primary Examiner—Gene Wan
Attorney, Agent, or Firm—John F. Moran; Lawrence C. Edelman

[57] ABSTRACT

A highly aligned optical device which includes an optical element with an optical surface to which are attached electrodes in which is installed in a housing which includes a transparent enclosure for defining a lens. The optical element is very carefully aligned in three dimensions within the transparent enclosure lens and the lens surface is specially contoured to optimize the mechanical/optical characteristics of the device. The device may be an emitter in which case the device is instrumental for generating a very narrow collimated beam of LED rays, or a detector with a special lens which receives the narrow beam of LED rays and focuses the beam to fill the optically active area of detectors to maximize and optimize the current transfer ratio between the emitter and the detector over distances.

15 Claims, 11 Drawing Figures

HIGHLY ALIGNED OPTICAL DEVICE

BACKGROUND OF THE INVENTION

This invention relates to highly aligned inexpensive optical devices including emitters which are useful for generating a narrow infrared/optical beam and detectors for detecting the beam efficiently and accurately.

In electronic circuits information is processed and transmitted from point to point through electrical wires. However, in many situations it is desirable and some times absolutely necessary that information be transmitted through space by electromagnetic waves. The present invention concerns itself with transmission over relatively short distances measured in inches or at most 100 feet through devices which generate or which are capable of receiving narrow beams of electromagnetic radiation. Furthermore, the present invention deals with extremely inexpensive devices in particular LED devices which may be manufactured at costs which amount to a fraction of a dollar per device. These devices are not, however, limited to signaling applications. They can be used as sensors for part counters on a conveyor belt, as precise edge locators, door chimes or switch actuators for controlling lights or appliances in a home. Other devices such as lasers which are capable of collimating light into narrow beams are not viewed as coming under the contemplated disclosure of the present invention.

In particular, the present invention is related to inexpensive emitters and to phototransistors which are useful for receiving emitted energy and for generating an electrical output proportional to the radiation which impinges upon the device. For information transmission, it may be useful to modulate an emitter by turning it on and off to generate a stream of 1's and 0's. The emitted energy may be received by a phototransistor and reconstructed as the original digital information. In other applications there may be provided an array of emitters and receivers which are spaced and arranged oppositely from each other such that light from each emitter reaches a respective preassigned detector without interference from the other emitters. Such arrays are useful for implementing computer touch screens and other control matrixes.

It is seen, therefore, that the infrared beam from each emitter must be highly directional and capable of being aimed in a desired direction accurately. However, present technology and methods for packaging infrared emitters and photo detectors with lens allow the radiating surface of an emitter or the active area of a detector to be assembled inaccurately and inconsistently only. For example, the orientation of the emitting surface to the optical reference of the lens associated with standard LED emitters can vary by +/−50%. Likewise, in a detector the detecting surface could only be oriented to an accuracy of +/−50% relative to its lense optical reference and consequently most of the energy contained in the emitter beam would not be received at the detector surface and converted to an appropriate electrical output.

Prior art devices, furthermore, are packaged so that much of the infrared radiation generated by the emitter tends to disperse through space. Consequently, only a small fraction of the energy reaches a detector which is positioned only inches away resulting in a very low current transfer ratio (CTR) between emitter and detector. The CTR is a ratio based on the quantity of current generated by the emitter in relation to a quantity of current introduced at the detector.

SUMMARY OF THE INVENTION

It is an object of the present invention to disclose an optical device, which may be an emitter, capable of generating a very narrow electromagnetic beam or a receiver for receiving the narrow beam.

It is another object of the invention to disclose an optical device which is highly aligned within a mechanical package and which may allow a user to mount the device with confidence that the generated infrared or electromagnetic beam will be directed along a predetermined desired direction.

It is still further object of the present invention to disclose a highly aligned optical device which is inexpensive.

It is still a further object of the present invention to disclose an optical arrangement of emitters and detectors in which respective emitters have associated detectors assigned thereto and in which no interference is generated from one emitter to other non-assigned detectors due to dispersion of or misdirection of emitter energy.

The foregoing and other objects are realized by providing a highly aligned optical device which includes an optical element with an optically active surface to which are attached electrodes. Through the electrodes, an electrical circuit is used for controlling the operation of the optical element. Furthermore, the optical element is installed in a solid housing which includes a transparent enclosure which comprises a lens for focusing incoming or outgoing electromagnetic radiation. The optically active surface of the optical element is arranged within the housing such that its optical surface faces the transparent enclosure and such that its electrodes protrude from the housing to allow connection to the electrical circuit. The optically active surface of the optical element is positioned within the housing and aligned to its optical reference with a high degree of accuracy. This is necessary in order to impart to it the attribute that its emitted electromagnetic radiation is collimated and directed along the optical reference of the lens and hence contained in a very narrow cone about the optical reference of the enclosure. Fixed to the housing or comprising a part thereof are mounting means which are very accurately fabricated to be in mechanical alignment with the optical reference of the enclosure so that a user may install the optical device in a fixture with confidence that the emitted electromagnetic radiation or the active surface of a phototransistor detector are aimed in a desired direction.

The outside refracting surface of the transparent enclosure or lens is aspherically shaped and is positioned relative to the optically active surface of the element so that the emitted flux (of an emitter) is collimated and concentrated in a small spot size or, in the case of a detector, the rays impinging on the lens are converged to fill the optically active area of the detector.

In preferred embodiments of the invention it is provided that the optical reference of the enclosure and the active surface of the optical element are referenced to the three mechanical references of the optical device with an accuracy of better than 2.5 degrees.

In a still further embodiment, it is stipulated that the optical element is an infrared emitter of which more than 65% of the emitted flux is contained in a small spot size of less than one and one half inches at a distance of 20 inches away from the emitter.

The present invention also discloses that the optical device need not be an emitter but may be instead a detector which is also highly aligned within its package to allow it to receive a substantial amount of the infrared energy that enters through the lens.

Furthermore, it is also disclosed that the optical devices, which may include both emitters and detectors may be combined in a larger system to provide a large gap interrupter arrangement which includes at least one emitter and at least one detector which are arranged such that emitters face respective detectors. The detectors can be placed in relative proximity to one another and because of the small spot size of each emitter beam interference from neighboring emitters is avoided. Such an arrangement may be useful in control matrices e.g. such as touch panels and terminals.

Finally, the present invention also discloses a method for the fabrication of optical devices of the type which include an optical element with optically active surface to which are attached electrodes which are installed in a housing comprising a transparent enclosure and which also includes mounting means to allow the optical element to be accurately aligned within the housing. The method includes the steps of accurately positioning the optical element on a lead-frame on which may be installed a plurality of optical elements with great mechanical alignment precision. By providing reference holes in the lead frame the optical elements can be installed into an injection molding apparatus with a high degree of accuracy and alignment. The injection molding apparatus also produces on the housing of the optical element mounting means which allow a user to align the optical element in its fixture accurately.

Other features and advantages of the invention will be apparent from the following description of the preferred embodiments, and from the claims.

For a full understanding of the present invention, reference should now be made to the following detailed description of the preferred embodiments of the invention and to the accompanying drawings.

DETAILED DESCRIPTION

Figure 1:
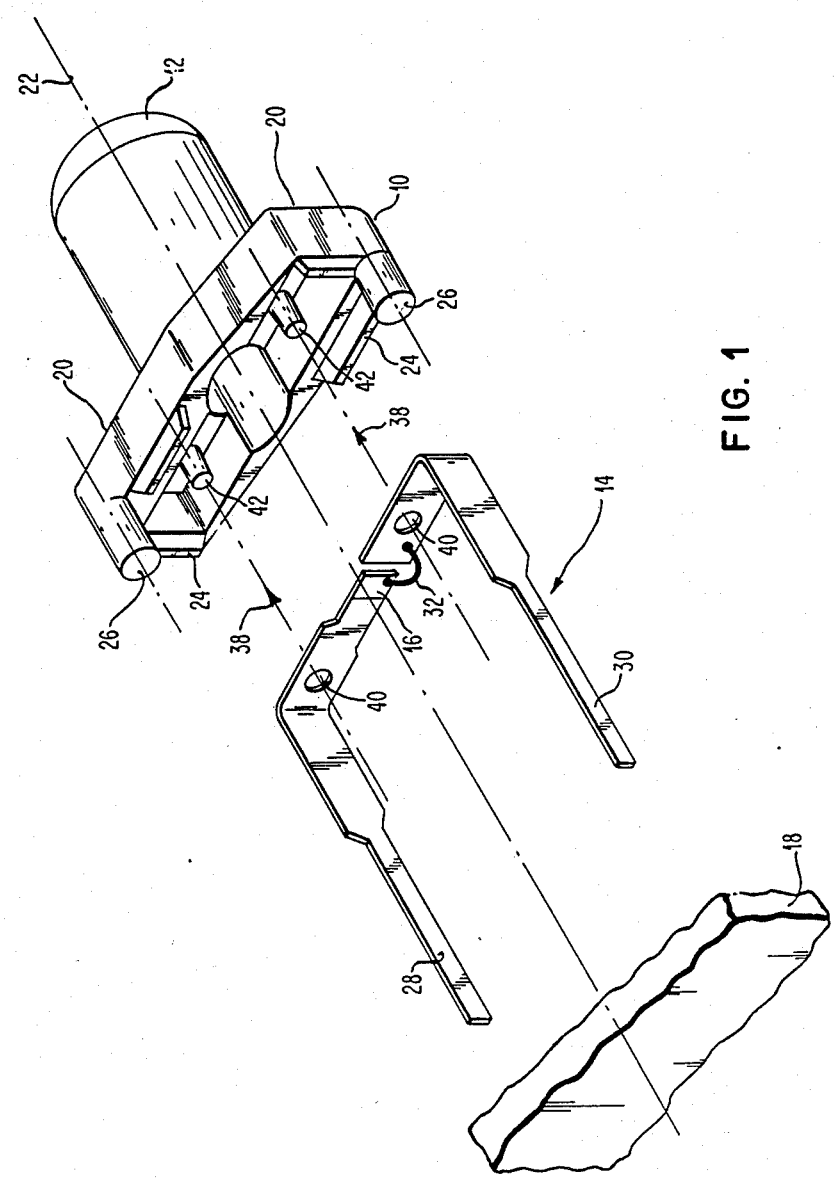
FIG. 1 shows an optical device in accordance with a preferred embodiment of the invention.

Preferred embodiments of the invention will now be described with reference to FIGS. 1 through 6 of the drawings.

A principal objective of the invention is to provide a light emitting diode LED and a phototransistor which are packaged in a lens housing such that the greatest portion of the light from the LED is confined into a narrow beam situated around the optical reference of the lens. Similarly, the phototransistor is positioned within a lens such that incoming LED rays are focused onto a light sensitive surface of the phototransistor.

The traditional LED device is a semiconductor component capable of emitting light when stimulated by an electrical source. As is well known, an LED is produced by depositing semiconductor materials according to a predefined pattern on a semiconductor substrate wafer. Thereafter, the wafer is cut into individual dies to which electrodes are attached and which are later packaged in a lens in order to improve the visibility of the light emitted from the LED device. LED devices have been commonly used for indicators or as sources of infrared light. As such the design of the standard LED device has been optimized to produce the greatest amount of infrared radiation.

That this inexpensive LED device can be used as a signaling device by collimating the LED rays of the device into a narrow beam and combining the device with a silicon phototransistor has not occurred to those skilled in the art. Nor in fact has anyone been successful in the past in producing a device of the characteristics according to the present invention.

As electro-magnetic radiation travels through space its intensity is diminished in accordance with a relationship which depends on the square of the traveled distance. Furthermore, the radiation from a point source diverges so that its energy is dispersed widely making it difficult, if not impossible, to capture the radiation which has been emitted from the source. However, if the LED rays from a source could be fully collimated, the light rays would travel along lines which are parallel to each other and would resemble a pencil of rays the energy of which could be captured by a detecting phototransistor, recovered and reproduced. The present invention succeeds in producing such a device by optimizing the position of the optical element relative to the lens surface of the device and by providing a specialized lens contour which is well-suited for collimating the LED rays which are emitted from the optical element. Furthermore, the mechanical packaging of the device, both internal and external, are such that the optical reference of the device, the optical element itself, and special mounting means are carefully aligned so that the device can be reliably mounted in a fixture. Thus it can be guaranteed that the emitted LED rays will consistently high the target they are aimed at.

Likewise, in a detecting phototransistor, lens are provided which are specially tailored to receive much of the energy which is contained in the pencil of LED rays and to focus the energy contained in the rays onto the optically active surface of the detector.

Through the collimated emitting diode and the specially designed detector of the present invention infrared rays can be coupled over some distances. The capability of coupling the energy from one optical device to another over distances can be used to advantage in many applications. For example, a pair composed of an emitter and a detector, with very few external components and a minimal power requirement and no external optics could be implemented as a sensor for a part counter across a conveyer belt. Or the same scheme could be used as a precise edge locater, a door chime, a switch for controlling lights or electrical appliances in a home, an interference free communication channel, etc.

Computer touch screens and other control matrixes with high optical resolution and signal-to-noise ratios can be achieved economically both in terms of cost and drive circuitry. Tests have shown that a 0.25 inch rod will effectively shut off the detector with a separation of 20 inches from the large gap emitter.

But, the coupling of LED rays from an emitter to a detector can be discussed in terms of feet also. High fidelity FM transmissions have been achieved with a one-stage of non-tuned amplifications and 100 miliamps average emitter drive over distances of 30 feet with an emitter and detector pairs according to the present invention. This opens the way for simple and low cost perimeter security systems without the additional requirement for external optics, as well as digital or analog transmission through the atmosphere as previously discussed. Because of the narrow beams of the LED rays, several discrete channels of data can be run simultaneously such as in an airplane, or noise-free transmission channels can be provided for industrial plants.

The mechanical features associated with the highly aligned optical device according to the present invention are illustrated in FIG. 1. Primarily, the emitter or the detector of an emitter-detector large gap pair consists of a housing 10 with a front piece which comprises a lens 12, a lead frame 14 to which an optical element 16 is attached, and an epoxy material 18 which is used to backfill the housing 10 so that the lead frame and the optical element 16 are retained within the housing 10. The usefulness and utility of the optical device are further enhanced due to the standard packaging of the device in a standard T-1 & ¾ package. The housing and optics of the device are integrated in a precision molded only carbonate package which provide three accurate package references. A first reference is provided by arranging the package shoulders 20 to be perpendicular to the optical axis 22 of the lens 12 of the optical device. Furthermore, the bottom seating plane 24 is parallel to the shoulder of the device and consequently provides a second package mounting capability. Lastly, there are provided several 0.060 inch diameter mounting pins 26 which are parallel to the optical axis 22 of the lens.

These features provide accurate chassis bezel mounting, and/or PCB mounting options to the user. To make these features useful, the optical axis and the mechanical axis are guaranteed to coincide to better than 2.5 degrees.

In other words, because of the extreme mechanical precision in the fabrication of these devices the very narrow beam will consistently and reliably hit a target at which it is aimed. To achieve this performance, mechanical tolerances of less than 0.002 inches are employed in fabricating and aligning the devices.

The objectives of the present inventions are to disclose a LED and a photodetector optical system which would minimize the effect of the separation of distance on the coupling of energy between the LED emitter and the detector. Consequently, design concepts which are unique and different from the traditional approachs of LED and packaging approachs are employed. The coupling of energy between two devices may be measured by the so-called current transfer ratio (CTR) which measures the current output at a detector in response to a current input at an emitter for two devices which operate at relatively comprable voltage levels. The devices according to this invention have achieved CTRs which are clearly ordered of magnitudes higher than any existing packages of similar sizes and price. To achieve these objectives the emitter must be provided with optics which are intended to magnify the emitter axis area to a size which would make full use of the detector optics aperture. In other words, the emitted radiation should fill the entire useful area of the detector lens to maximize the transfer of energy. Since under normal circumstances radiation diverges and disperses over space a detector would have to be very large in order to receive a significant amount of the energy emitted at even short distances away from the emitter. In order to make the current transfer ratio independent of the distance between the emitter and the detector, the emitted radiation should be perfectly collimated. Collimate means "to make (as rays of light) parallel". If perfect collimation would be achieveable the only effect of distance on the output current of the device would be the inverse square low (power diminishes inversely to the square of the distance). Perfect collimation, however, is impossible. So tradoffs are employed in each case to maximize the collimation of the rays which requires that design approachs which are consistently contrary to accepted practices are pursued.

Accordingly, the optical device disclosed herein differs from traditional emitters in several important ways. Firstly, the device is provided with packaging and alignment mounting means which are not included in prior device. Furthermore, while in prior devices it was found beneficial to mount or position the actual emitting surface of the diode very close to the lens surface in order to maximize the brightness of the LED, in the present device the emitting surface is placed as far as practical behind the lens surface in order to increase the focusing and collimating power of the device even at a sacrifice of the total output energy. Furthermore, in contrast to prior LED devices the die is chosen to have as small a radiating surface as possible in order to achieve superior collimation through choosing, as far as possible, a "point source" as necessary for perfect collimation.

The present emitter produces a spot size of less than 1.5 inches in diameter at a distance of 20 inches from the emitter. Traditional devices which place the lens very close to the light emitting surface, while producing more flux, focus the light at very short distance from the lens which is roughly equal to the light emitting source distance from the lens. In such devices the rays would diverge at equally large angles and would result in a spot size at 20 inches which would be measured in several feet rather than the 1.5 inches spot size according to the present invention.

Figure 3:
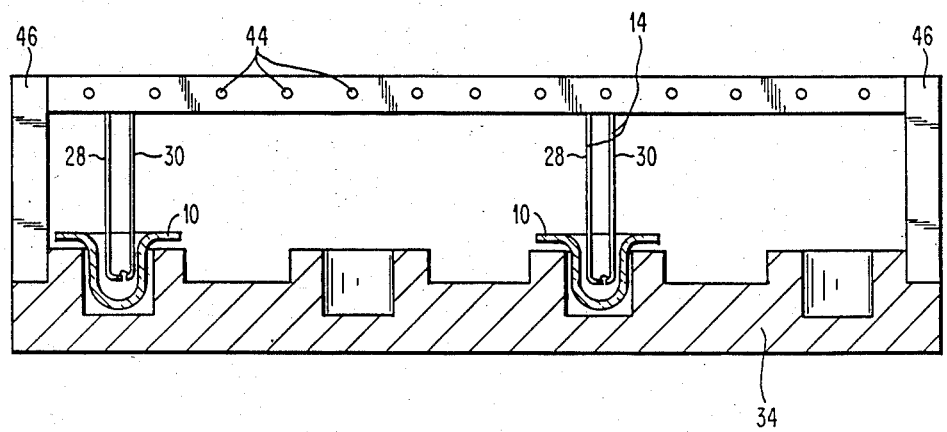
FIG. 3 shows the manner of inserting a lead frame into a mold during its manufacture.
Figure 4A:
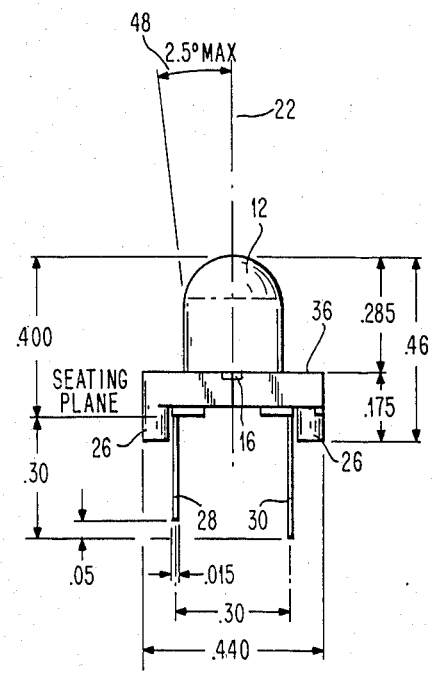
FIGS. 4a–4c show the mechanical dimensions of a typical optical device from several perspectives.
Figure 4B:
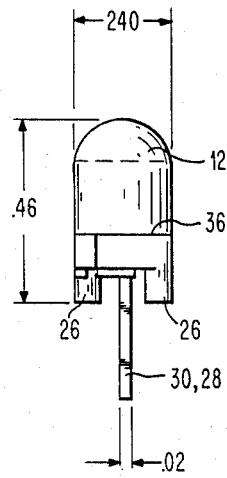
Figure 4C:
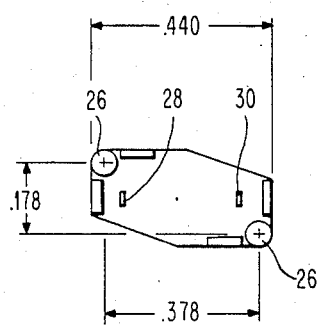

Also in FIG. 1 the optical element 16 is connected directly to a first electrode 28. For completing an electrical circuit a second electrode 30 is provided as part of the lead frame 14. A wire 32 which is attached at a pad of the optical element 16 which completes the circuit. The electrodes 28, 30, optical element 16 and the wire 32 are placed into a mold 34 (FIG. 3) which is shaped as a lens and a transparent encapsulating material is allowed to fill the mold and encapsulate the electrodes and the LED die. The LED with its electrodes and mounting base 36, are also shown in FIG. 4. The device can also be mounted at a fixture (not shown) through suitable mounting means which may include for example screws or a snap-in mechanism.

FIG. 1 also shows that the lead frame 14 includes aligning holes 40 which allow the lead frame to be precisely placed within the housing 10. The arrows 38 show that the aligning holes 40 are placed over and fit onto the complementary aligning pins 42 which are provided in the housing. This feature provides or allows the extreme or mechanical precision to be obtained.

Figure 2:
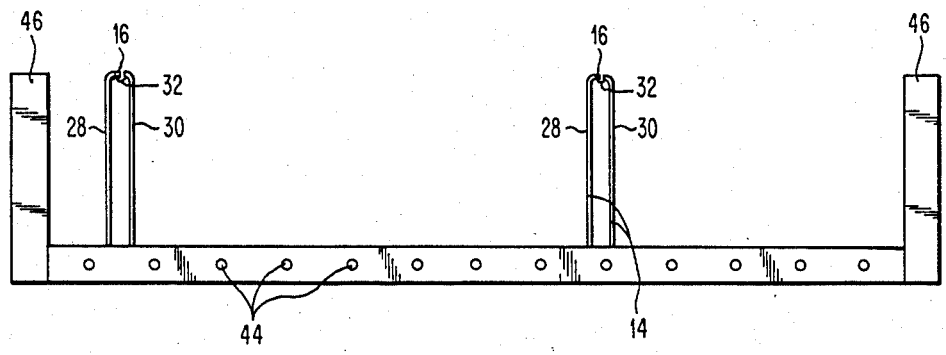
FIG. 2 shows a lead frame to which are attached a multiplicity of electrodes and optical elements.

The fabrication of optical devices does employ procedures which allow the devices to be manufactured at extremely low costs. FIGS. 2 and 3 show several of the steps in the manufacturing of the devices. In FIG. 2 it is seen that lead frame 14 is fabricated to support the attached electrodes 28, 30 which in turn support the optical elements 16. The lead frame 14 is also provided with guiding holes 44 and end blocks 46 which allow it to be adapted into an injection molding apparatus 34 shown in FIG. 3. Through the end blocks 46 of the lead frame extreme mechanical precision is obtained in placing the optical elements which are attached to the lead frame into the molding apparatus 34 so that precise positioning, in three dimensions, within the lens housing 10 is obtained.

FIG. 4 shows essentially a device in accordance with FIG. 1 with the additional inclusion of mechanical dimensioning of a preferred embodiment of the invention.

Other features and attributes of the optical device in accordance with the present invention which provide these devices with their special performance result from the selection of specific materials for their fabrication and from their operating parameters which will be described below.

FIG. 4 shows that the device allows a maximum of 2.5 degrees in the mechanical to optical alignment tolerance angle 48. It is also shown that the effective diameter of an emitter is 0.240 inches for the device shown in FIG. 4. This diameter is preferred, because it allows the device to generate a pencil of beam with a spot size which is optimized for a complementary photo transistor detecting device which is matched to receive the LED beam of the emitter. In a preferred device the emitter is chosen to be a gallium arsenide vapor difused device with a peak response which is chosen to be in the frequency band which lies near the maximum sensitive response of silicon phototransistors. The optically active area of an emitter is deliberately selected to be as small as possible to achieve the so-called "point source" approximation for the emitter. Consequently, a special emitter with a 0.008 inch diameter circle is chosen even though the device does not generate a maximum amount of output light or operates with the greatest possible efficiency.

As has been described earlier, the optically active element is placed as far back from the lens itself in order to achieve a longer focal length which would result in the collimation of the rays generated by the light emitting diode. In the preferred embodiments of FIG. 4 where the optical element 16 is positioned approximately 0.285 inches away from the lens 12 a focal length of 15 inches in front of the lens is achieved. Calculations and tests have shown that with the special lens which employs an 8th order aspherical surface the beam divergence does not exceed the lens diameter for approximately 5 inches and thereafter begins to diverge with a half angle of 2.7 degrees.

Figure 7:
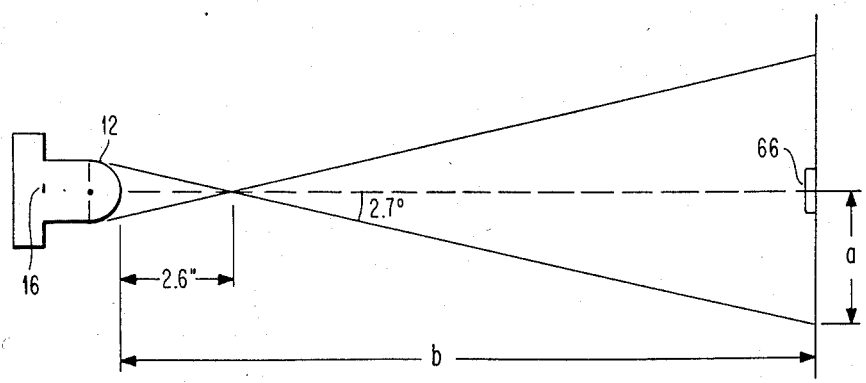
FIG. 7 shows an optical device in plan view to illustrate the geometry of the emitted beam.

From the geometry shown in FIG. 7, the spot diameter 2a is determined by the formula:

$$2a = 2 \times \tan 2.7 \times (b - 2.6),$$

where 2.7° is the calculated (and experimentally determined) maximum divergence and b is the distance from the tip of the emitter lens to the point of observation along the axis. The number 2.6 is the distance in inches from the tip of the emitter to the point where the most diverging rays first cross the axis.

In essence, the present invention provides an inexpensive optical device which exhibits an extremely small beam divergence. This is accomplished by arranging the radiation source (in the case of an emitter) or radiation detector (in the case of a detector) at some distance from the lens so as to significantly improve the collimating ability of the device. Although conventional wisdom would dictate placing the light source at the focal point of the lens so that the lens can capture as much radiation as possible, it may be shown that more light flux will pass through a small cross-sectional area on the optical axis at a point remote from the optical device if the light source is moved away from the lens. Although in theory, a point source placed at the focal point of a lens result in perfectly collimated light, there are a number of factors which prevent this in practice:

1. The source is not, and cannot be a point source;
2. The source is not positioned exactly on the optical axis; and
3. The lens is not a perfect collimator.

Moving the source away from the lens results in an improvement in collimation performance because:

1. The source, which has finite dimensions, looks more and more like a point source;
2. The positioning of the source on the optical axis becomes less and less critical; and
3. A smaller and smaller relative area of the lens is used to collimate the beam, thus improving the lens performance.

Figure 8:
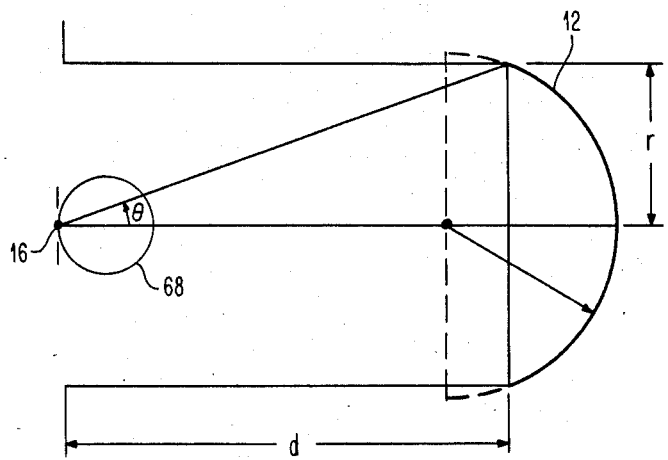
FIG. 8 shows an optical device in plan view to illustrate the geometry of the source-lens relationship.

FIG. 8 illustrates the optical geometry of the source 16 and lens 12. Since the source is positioned a distance d relatively far away from the lens, it may be viewed as a point source. Its emission characteristics are not unidirectional, however. Rather, the LED 16 has a lambertian radiation pattern, indicated in FIG. 8 by the line 68 according to the formula:

$$I = I_o \cos \theta,$$

where $\theta$ is the angle the ray makes with the optical axis. Assuming the lambertian source, it is possible to calculate the flux F(r,d) which is captured (intersected) by the active aperture area of the lens. This flux, which passes through a disc of radius r at the distance d, is given by:

$$F(r,d) = \int_o^r I \, da = \int_o^r \frac{I_o \cos \theta \, 2\pi \, r \, dr}{d^2 + r^2}$$

Since $\cos \theta = d/\sqrt{d^2 + r^2}$, $$F(r,d) = \int_o^r \frac{I_o \, 2\pi \, d \, r \, dr}{(\sqrt{d^2 + r^2})^3}$$

-continued $$= Io\, 2\pi d \left[ \frac{-1}{\sqrt{d^2 + r^3}} \right]_o^r =$$

$$Io\, 2\pi d \left[ \frac{-1}{\sqrt{d^2 + r^2}} + \frac{1}{d^2} \right]$$

$$= Io\, 2\pi \left[ 1 - \frac{d}{\sqrt{d^2 + r^2}} \right]$$

Figure 9:
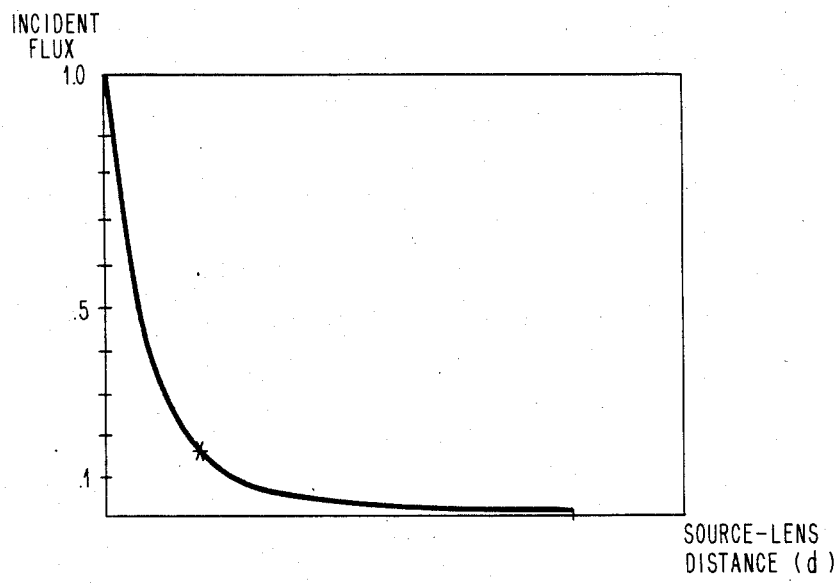
FIG. 9 is a graph of incident flux on the lens versus source-lens distance.

FIG. 9 is a graph showing the dependency of the flux $F(r,d)$ as a function of the distance d, assuming a constant lens radius r. As may be seen, the flux initially falls very rapidly with increasing distance and then levels off and approaches zero. In order to calculate the flux incident on the lens for the optical device of the present invention, we let r equal 0.0120 and d equal 0.200. Substituting these numbers in the flux formula, we have:

$$F(r,d) = Io\, 2\pi \left[ 1 - \frac{.2}{\sqrt{(.2)^2 + (.12)^2}} \right] = Io\, 2\pi(.143)$$

If we look on the graph of FIG. 9, we see that the flux value 0.143 is extremely far down on the curve. This should be compared to conventional LED packages in which the lens captured flux is 0.5 or greater. The present invention is based on the discovery that a greater amount of flux can be projected toward a remote point by reducing the amount of captured light in order to improve the collimating capabilities of the optical system.

While the present description speaks generally of an optical device it is clear that the optical device refers to two distinct different types of devices. The first may be an emitter in which the optical element generates LED rays which are refracted and collimated through the specially designed lens of the present invention. The other is a detecting device in which the optical element of a phototransistor generates an electrical output in proportional to the amount of light which strikes its active optical surface. The lens of a detecting device are specially contoured to gather as much of the incident rays and to focus those rays into a spot size which exactly covers the optically active surface of the phototransistor.

In the present invention the lens of a detector uses special a plastic lens technology to contour the surface of the lens close to ideal requirements. The molded lens according to the present invention is more efficient and can be implemented at a greatly reduced cost as compared to glass technology. The radii of curvature vary across the lens to achieve the special requirements for the emitters and detectors of the present invention as previously described. For a detecting device the plastic lens incorporate a filter function developed by GE plastics for IR (infrared) applications. The filters are very effective in filtering out visible light and thus result in greatly improved signal-to-noise ratio performance for the emitter/detector pair.

The emitter is also selected so that it has a peak response at or near a wave length of 880 nano meters. This results in improved performance because the silicon transistors are optimized to respond to these frequencies.

Figure 5:
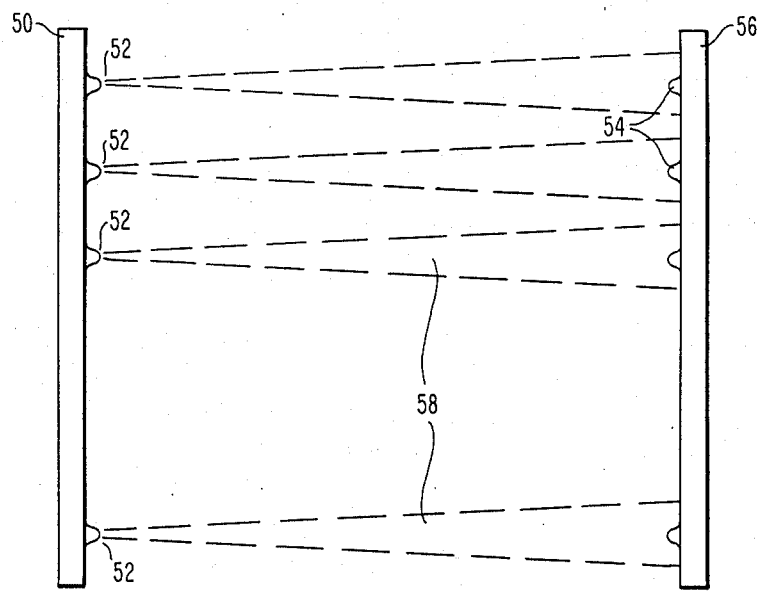
FIG. 5 shows the idea of a large gap interrupter arrangement in accordance with a preferred embodiment of the invention.
Figure 6:
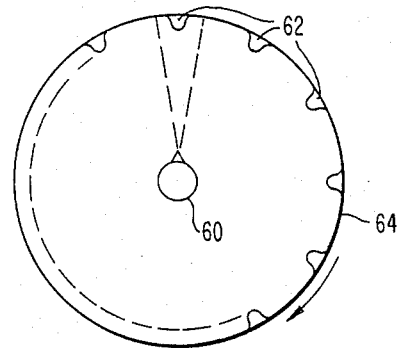
FIG. 6 shows a further embodiment in which an emitter is combined with several detectors for determining rotational speeds.

FIGS. 5 and 6 show two embodiments in which optical devices including emitters and detectors are used in specific applications. In FIG. 5, an array of emitters 52 is mounted at one wall of a fixture and a complementary array of detectors 54 is mounted at another wall 56.

Because of the extreme narrowness of the generated beams 50 the detectors can be placed relatively near to each other while avoiding interference from beams generated by neighboring emitters. With such arrangements control matrices and touch panels can be implemented efficiently and reliably. The concept of FIG. 5 can be used for generating simultaneous multiple channel transmission lines and a host of other applications which are readily apparent to those skilled in the art. As just one typical example, in the housing industry the wiring and cabling necessary for installing lights and appliances in a building could be greatly simplified by running standard high voltage cables only in ceilings to which light and/or appliances are fixed. Through the walls only low level voltages would be run which would be sufficient to provide power to emitters which could be aimed at respective appliances in which detectors are included and the emitter/detector pair would be used to activate the electrical light and appliances. With this arrangement expensive wiring or cabling from switches to appliances would be avoided and expensive BX cables need not be run through side walls or buildings to provide standard 110/220 VAC power to switches.

FIG. 6 shows yet another embodiment in which an emitter 60 and an arrangement of the detectors 62 allow a device to quantize, measure and determine the rotational speed of the device. As the outside wall 64 of the device rotates, the detectors 62 intercept a fixed or pulsating beam of LED from the emitter 60. Because of the narrow beam only one detector is active at a time and electronics (not shown) which are interfaced to the detectors can be used to determine the exact positioning of the outer rotating surface with respect to a selected reference. Of course those skilled in the art will readily recognize that in order to determine speed it is not necessary to have a multiplicity of detectors and that a single pair of an emitter detector would suffice for the purpose of determining the rotational speed of the device.

There has thus been shown and described a novel optical device which may be either an emitter or a detector which fulfills all the objects and advantages sought therefor. Many changes, modifications, variations and other uses and applications of the subject invention will, however, become apparent to those skilled in the art after considering this specification and the accompanying drawings which disclose preferred embodiments thereof. All such changes, modifications, variations and other uses and applications which do not depart from the spirit and scope of the invention are deemed to be covered by the invention which is limited only by the claims which follow.

What is claimed is:

1. A highly aligned optical device, comprising:
   (a) an optical element with an optical surface;
   (b) at least two electrodes which are attached to said optical element;
   (c) a housing, said optical element and at least a portion of said electrodes being installed therein, said housing including a transparent enclosure, a portion of the outer surface of said transparent enclosure defining a lens having an associated optical reference for optically guiding electromagnetic radiation associated with said optical element, said optical element being mechanically aligned with said optical reference to better than 2.5°, said optical element being placed within said housing to optimize coupling of said radiation between said device and free space; and (d) mounting means for allowing a user to mount said optical device with accuracy at a fixture, said mounting means being also aligned to said optical reference of said transparent enclosure such that said alignment accuracy is preserved.

2. The optical device according to claim 1, wherein said mounting means includes a plurality of mechanical reference points located on said optical device for defining a three coordinate axis reference system, and said optical element is mounted within said housing such that the optical reference of said enclosure is referenceable to any point defined by said three coordinate axis reference system of said optical device to within 2.5°.

3. The optical device according to claim 2, wherein said optical element is an infrared emitter and wherein said element is mounted so that more than 65% of emitted flux from said element is collimated and concentrated in a small spot size of less than 1½ inches at a distance of 20 inches from said optical device, said small spot size being centered around said optical reference of said enclosure.

4. The infrared emitter according to claim 3, wherein said lens is an injection-molded aspherical surface designed to collimate LED rays of said emitter, said aspherical surface being formed to refract said rays such that most rays are parallel with rays passing through said optical reference.

5. The emitter according to claim 4, wherein said emitter comprises a GaAs vapor diffused device which emits a peak wavelength closely matched to that of standard silicon response.

6. The emitter according to claim 5, wherein said peak wavelength is 890 nm.

7. The emitter according to claim 4, wherein said optical surface comprises an area of less than $\pi$ times $(0.004)^2$ square inches.

8. The emitter according to claim 7, wherein said lens collimate said rays to produce a spot size of near 0.045 square inches.

9. The optical device according to claim 1, wherein said housing is comprised of materials used in injection molded packages, and wherein said optical device is produced in part by injection molding techniques.

10. The optical device according to claim 1, wherein said mounting means comprise molded protrusions projected from a flat pedestal of said housing, said protrusions being operative for allowing easy and accurate mounting of said optical device in a fixture with no less of said alignment accuracy.

11. The optical device according to claim 2, wherein said optical element comprises a detector for detecting said radiation and for generating an electrical output signal having an amplitude in proportion thereto which is applied to said electrodes, said radiation comprising infrared rays which impinge upon said lens.

12. The optical device according to claim 11, wherein said detector comprises a silicon phototransistor.

13. The optical device according to claim 1, wherein said detector comprises a pin-photodiode.

14. The optical device according to claim 3, further including:

(a) an infrared detector, comprising,
    an optical element with an optical surface,
    at least two electrodes which are attached to said optical element,
    a housing, said optical element and at least a portion of said electrodes being installed therein, said housing including a transparent enclosure, a portion of the outer surface of said transparent enclosure defining a lens having an associated optical reference for optically guiding electromagnetic radiation associated with said optical element, said optical element being mechanically aligned with said optical reference to better than 2.5°, said optical element being placed within said housing to substantially optimize coupling of said radiation between said device and free space, and
    mounting means coupled to said housing for mounting said optical device with accuracy on a support, said mounting means being also aligned to said optical reference of said transparent enclosure such that said alignment accuracy is preserved; and (b) a fixture in which said infrared emitter and infrared detector are mounted, said emitter and detector being positioned on said fixture with their respective optical references coaxially aligned so that said detector detects said emitted flux from said emitter and supplies to an output of said detector an electrical signal having an amplitude in proportion to the amount of said emitted flux which is detected.

15. The optical device according to claim 14, wherein said emitter and said detector are capable of being put in motion with respect to each other and wherein said device is operative for quantizing said motion.

* * * * *